United States Patent
Phillips et al.

(10) Patent No.: US 11,703,528 B2
(45) Date of Patent: Jul. 18, 2023

(54) POWER CORDS THAT MEASURE AND REPORT ELECTRICAL ENERGY CONSUMPTION, AND RELATED HARDWIRED APPARATUSES AND METHODS

(71) Applicant: Duke Energy Corporation, Charlotte, NC (US)

(72) Inventors: David Brian Phillips, Martinsville, IN (US); Steven Patrick Hinkel, California, KY (US); Laura Lilienthal Black, Charlotte, NC (US)

(73) Assignee: Duke Energy Corporation, Charlotte, NC (US)

( * ) Notice: Subject to any disclaimer, the term of this patent is extended or adjusted under 35 U.S.C. 154(b) by 93 days.

(21) Appl. No.: 17/158,389

(22) Filed: Jan. 26, 2021

(65) Prior Publication Data
US 2021/0231715 A1    Jul. 29, 2021

Related U.S. Application Data

(60) Provisional application No. 62/966,277, filed on Jan. 27, 2020.

(51) Int. Cl.
*H04B 3/46* (2015.01)
*H04B 3/54* (2006.01)
*H04W 4/38* (2018.01)
*G01R 22/06* (2006.01)

(52) U.S. Cl.
CPC .......... *G01R 22/065* (2013.01); *G01R 22/063* (2013.01); *H04B 3/46* (2013.01); *H04W 4/38* (2018.02)

(58) Field of Classification Search
None
See application file for complete search history.

(56) References Cited

U.S. PATENT DOCUMENTS

| | | | |
|---|---|---|---|
| 10,552,925 B2 * | 2/2020 | Somers | G06Q 50/06 |
| 10,728,102 B1 * | 7/2020 | Lerner | G06F 1/28 |
| 2002/0000092 A1 * | 1/2002 | Sharood | G06Q 20/105 62/127 |
| 2012/0229296 A1 * | 9/2012 | Ree | G01D 4/002 340/870.02 |
| 2015/0311951 A1 * | 10/2015 | Hariz | H04W 88/16 375/257 |
| 2016/0305992 A1 * | 10/2016 | Yeo | G01R 22/063 |

(Continued)

FOREIGN PATENT DOCUMENTS

| | | | | |
|---|---|---|---|---|
| JP | 2008257347 A | * | 10/2008 | |
| WO | WO-2016111604 A1 | * | 7/2016 | G05B 19/042 |

OTHER PUBLICATIONS

JP-2008257347 English Translation Image (Year: 2008).*

*Primary Examiner* — Thomas D Alunkal
*Assistant Examiner* — Jerold B Murphy
(74) *Attorney, Agent, or Firm* — Myers Bigel, P.A.

(57) ABSTRACT

Power cords are provided. A power cord includes measurement circuitry configured to measure electrical energy consumption by an apparatus that is connected to the power cord. The power cord also includes first transceiver circuitry configured to transmit data regarding the measured electrical energy consumption to second transceiver circuitry that is spaced apart from the power cord. Related hardwired apparatuses and methods are also provided.

27 Claims, 14 Drawing Sheets

(56) References Cited

U.S. PATENT DOCUMENTS

| | | | | |
|---|---|---|---|---|
| 2016/0327598 A1* | 11/2016 | Seo | .................. | G01R 21/133 |
| 2018/0041072 A1* | 2/2018 | Clifton | .................. | H02J 3/14 |
| 2019/0115785 A1* | 4/2019 | Kallamkote | .......... | H04L 67/125 |

* cited by examiner

POWER CORDS THAT MEASURE AND REPORT ELECTRICAL ENERGY CONSUMPTION, AND RELATED HARDWIRED APPARATUSES AND METHODS

CROSS-REFERENCE TO RELATED APPLICATION

The present application claims priority to U.S. Provisional Patent Application No. 62/966,277, filed on Jan. 27, 2020, the entire content of which is incorporated herein by reference.

FIELD

The present disclosure relates to communications systems and to measurement of electrical energy consumption.

BACKGROUND

Customers of an electric utility may desire to better manage their electrical energy consumption, as they may be motivated to reduce waste and cost. Such customers, however, may lack information about where and when they are using energy, as well as how much energy they are using. They may also be reluctant to accept the burden of reconfiguring equipment in their homes or businesses in an attempt to better manage their consumption.

SUMMARY

A power cord, according to some embodiments herein, may include measurement circuitry configured to measure electrical energy consumption by an apparatus that is connected to the power cord. The power cord may also include first transceiver circuitry configured to transmit data regarding the measured electrical energy consumption to second transceiver circuitry that is spaced apart from the power cord.

In some embodiments, the first transceiver circuitry may include first power-line communication ("PLC") circuitry. Moreover, the second transceiver circuitry may include second PLC circuitry that is inside or adjacent an electric utility meter of a customer premise where the apparatus is located.

According to some embodiments, the power cord may include a plug on an end of the power cord. The measurement circuitry and the first transceiver circuitry may be inside the plug and/or inside a portion of the power cord that is adjacent the plug. Moreover, the power cord may be free of a solid-state relay and/or free of Wi-Fi circuitry.

In some embodiments, the apparatus may be an electrical appliance, which may be a refrigerator, a microwave oven, a toaster, a washing machine, or a clothes dryer. Alternatively, the apparatus may be an electronic device, which may be an electric vehicle, a television, a smartphone, a laptop computer, a tablet computer, a desktop computer, or a computer server. Moreover, the power cord may be a built-in power cord of the apparatus.

A hardwired electrical appliance or system, according to some embodiments herein, may include measurement circuitry configured to measure electrical energy consumption by the hardwired electrical appliance or system. The hardwired electrical appliance or system may also include first transceiver circuitry configured to transmit data regarding the measured electrical energy consumption to second transceiver circuitry that is spaced apart from the hardwired electrical appliance or system.

In some embodiments, the hardwired electrical appliance or system may be a heating, ventilation, and air conditioning ("HVAC") system, a solar battery storage, an electric vehicle charger, a water heater, a dishwasher, a garbage disposal, a stove, a ceiling fan, or a light fixture. The hardwired electrical appliance or system may not be an electric utility meter (e.g., may not be configured to measure electrical energy consumption by other apparatuses).

According to some embodiments, the first transceiver circuitry may include first PLC circuitry. Moreover, the second transceiver circuitry may include second PLC circuitry that is inside or adjacent an electric utility meter of a customer premise where the hardwired electrical appliance or system is located.

A method, according to some embodiments herein, may include measuring, via measurement circuitry that is inside an apparatus or that is inside a power cord that is connected to the apparatus, electrical energy consumption by the apparatus. The method may also include transmitting, via a PLC connection, data regarding the measured electrical energy consumption to transceiver circuitry that is spaced apart from the apparatus. The measuring and the transmitting may be performed in a household, institutional, commercial, or industrial setting.

In some embodiments, the transceiver circuitry may include PLC circuitry that is inside or adjacent an electric utility meter of a customer premise where the apparatus is located. The apparatus, however, may not be an electric utility meter.

According to some embodiments, the transmitting may be performed via PLC circuitry that is inside a plug of the power cord and/or inside a portion of the power cord that is adjacent the plug. Moreover, the power cord may be free of a solid-state relay.

In some embodiments, the apparatus may be a hardwired electrical appliance or system, and the transmitting is performed via PLC circuitry that is inside the hardwired electrical appliance or system. Moreover, the measuring may be performed using a second conductor that wraps around one or more first conductors of the power cord and that is coupled to the measurement circuitry.

A method, according to some embodiments herein, may include receiving, by transceiver circuitry, a first PLC signal including first data regarding electrical energy consumption by a first apparatus that is at a customer premise. The method may also include receiving, by the transceiver circuitry, a second PLC signal including second data regarding electrical energy consumption by a second apparatus that is at the customer premise.

In some embodiments, the method may include transmitting the first and second data from the transceiver circuitry for cloud storage. Moreover, the transceiver circuitry may include PLC circuitry that is inside or adjacent an electric utility meter of the customer premise.

According to some embodiments, the method may include electronically transmitting, to an electric utility customer associated with the customer premise, a notification that the first apparatus is behaving atypically.

In some embodiments, the transceiver circuitry may include first PLC circuitry that receives the first PLC signal from second PLC circuitry that is inside a power cord that is connected to the first apparatus. The first PLC circuitry may receive the second PLC signal from third PLC circuitry that is inside the second apparatus. Moreover, the second apparatus may be a hardwired electrical appliance or system.

According to some embodiments, the method may include receiving, by the transceiver circuitry, an indication of a manufacturer of the first apparatus, an indication of an apparatus species of the first apparatus, and/or an indication of a model of the first apparatus. Moreover, the method may include receiving, by the transceiver circuitry, an indication of a length of time that the first apparatus has been on.

DETAILED DESCRIPTION

Pursuant to embodiments of the present inventive concepts, communications and measurement technology can be miniaturized and embedded into various power cords and hardwired apparatuses to capture and transmit itemized electrical energy consumption/behavior data for various apparatuses, including electrical appliances/systems and/or electronic devices. Such data may be transferred via PLC to a PLC transceiver that is located in or near an electric utility meter for subsequent transmission into cloud storage. The use of embedded PLC technology enables a zero-configuration experience for customers of the electric utility, and also ensures that data is associated with the correct customer account.

The PLC transceiver may receive data in real time. For example, the PLC transceiver may receive real-time energy usage data that may be personalized for a household or business and aggregated for all connected apparatuses in the household or business. As used herein, the term "connected apparatus" refers to an apparatus for which communications and measurement technology is embedded inside the apparatus or inside a power cord that is attached to the apparatus.

Also, the terms "connected" and "attached" may refer to a power cord that is (a) permanently (e.g., integrated/built-in) or (b) releasably (e.g., via a plug/connector) connected or attached to an apparatus. Moreover, the real-time energy usage data may be personalized for the household or business and disaggregated (e.g., individualized/itemized) for each connected apparatus in the household or business. Conventional software-based disaggregation, by contrast, has high error rates. In some embodiments, aggregated demographics and/or ownership trends may be provided for each apparatus. For example, data forwarded to the cloud for multiple customers can be analyzed to determine how a particular apparatus behaves (e.g., anonymously behaves) across the different customers. Also, apparatus performance verification statistics may be provided.

In some embodiments, apparatus efficiency may be determined with respect to different building sizes (e.g., different square footage ranges) or other neighborhood characteristics, using census information (or other neighborhood-level information), to draw generalizations about apparatus ownership, behavior, usage, and/or reliability. As a result, customers can be alerted to recommended equipment/appliances for their homes.

Rather than using a conventional ring around a wire to measure power through the wire, embodiments of the present inventive concepts use embedded measurement circuitry, which may be adjacent embedded PLC circuitry. For example, the embedded measurement circuitry may be configured to measure current and/or power consumption by an apparatus.

Example embodiments of the present inventive concepts will be described in greater detail with reference to the attached figures.

Figure 1A:
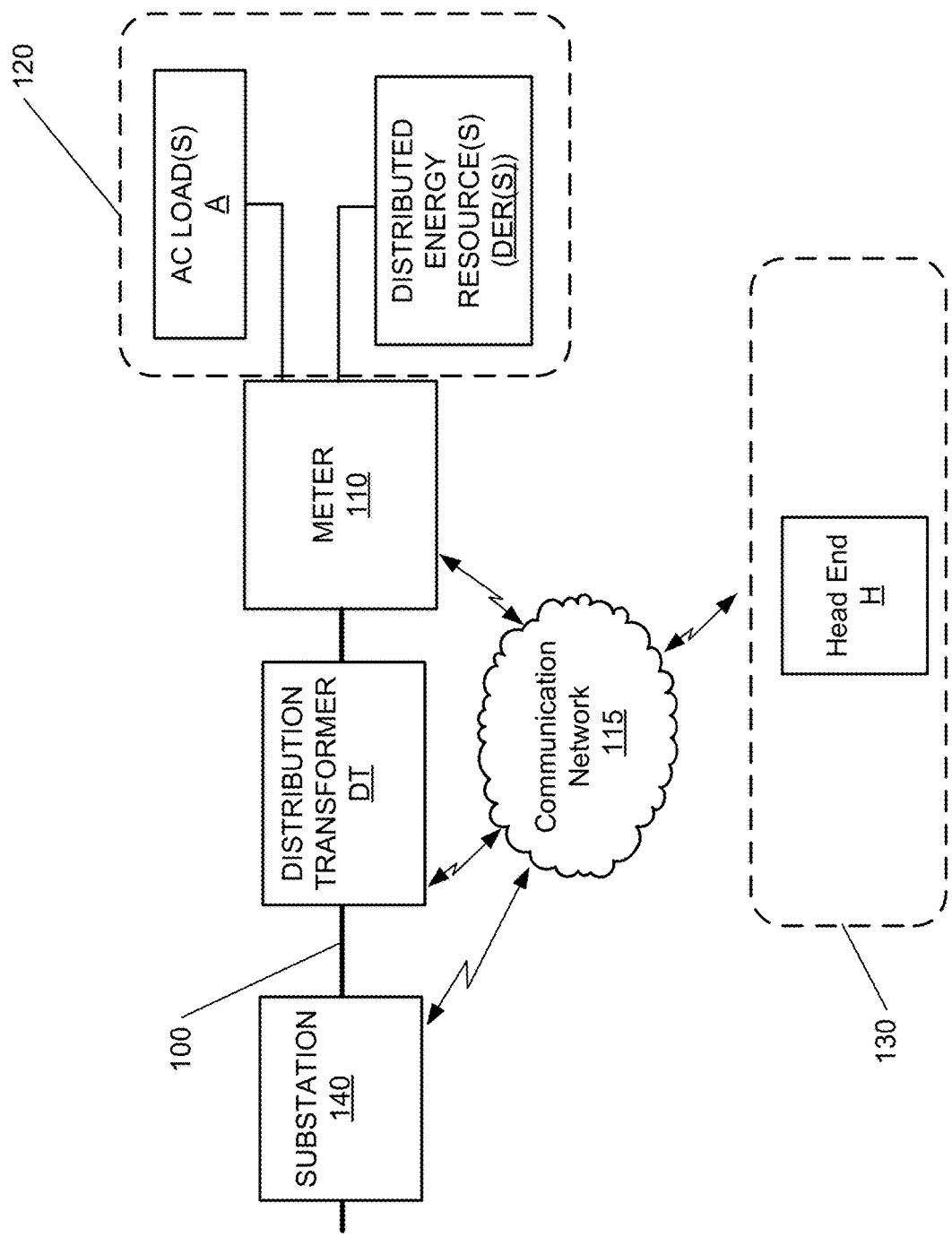
FIG. 1A is a schematic illustration of an electric grid that provides electricity to a premise of a customer of an electric utility, according to embodiments of the present inventive concepts.

FIG. 1A is a schematic illustration of an electric grid 100 that provides electricity to a premise 120 of a customer of an electric utility, according to embodiments of the present inventive concepts. An electric utility meter 110 is at or adjacent the customer premise 120. For example, the customer premise 120 may be a house, apartment, office, or other building, location, or structure, for which the meter 110 can be provided for the customer. A customer premise 120 may thus be a structure such as a billboard, as well as a home or a business. Accordingly, the term "premise," as used herein, may be interchangeable with the term "premises," in that either term may be used herein to refer to a building, part of a building, or other structure for which the meter 110 may be provided.

The meter 110 may be configured to interface with one or more distributed energy resources DER at the customer premise 120. For example, the meter 110 may be configured to interface with a solar photovoltaic ("PV") system, a fuel cell, an energy storage system, or an electric vehicle ("EV") charging station.

The meter 110 may provide electricity from the electric grid 100 to at least one Alternating Current ("AC") load A that is at the customer premise 120, and may measure electricity usage at the customer premise 120. For example, the AC load(s) A may include at least one electrical appliance that may be powered by the electric grid 100 through the meter 110. An electrical appliance may be a refrigerator, dishwasher, laundry machine (e.g., washing machine or clothes dryer), stove, microwave oven, a toaster, water heater, garbage disposal, industrial motor, a ceiling fan, a light fixture, or any other machine that uses electricity to perform, for example, cooking, cleaning, or food preservation functions in a household, institutional, commercial, or industrial setting, such as a private residence, a business location, or a public location. Moreover, a hardwired system may include a plurality of light fixtures and/or a plurality of ceiling fans.

Additionally or alternatively to appliances, the AC load(s) A may include various devices that use electricity and are connected to the meter 110. For example, consumer electronics and heating/cooling devices and/or systems may be at the customer premise 120. Moreover, in some embodiments, the customer premise 120 may be a billboard, and the electric grid 100 may provide power for lights or an electronic display of the billboard.

The meter 110 is downstream from an electric utility substation 140 that serves the customer premise 120. The substation 140 may include one or more transformers. Between the substation 140 and the meter 110 is a distribution transformer DT, which may control a voltage level of power that is transmitted to the meter 110. In particular, the distribution transformer DT serves the customer premise 120 and may be the closest transformer of the electric grid 100 to the customer premise 120. The distribution transformer DT may be underground, mounted on a concrete pad, mounted on a utility pole, or otherwise fixed at a location that is upstream and spaced apart from the meter 110.

A single distribution transformer DT may provide power to one or more customers in a given area. For example, in an urban area, a plurality of homes may be fed off of a single distribution transformer DT. Rural distribution, on the other hand, may use one distribution transformer DT per customer. Moreover, a large commercial or industrial complex may rely on multiple distribution transformers DT.

A distribution transformer DT has a low-voltage secondary (e.g., output) side that distributes power to one or more customers. For example, in the United States, the low-voltage secondary side of the distribution transformer DT may be configured for a 240/120-volt system, and three wires (including one neutral wire) may be fed from the low-voltage secondary side to the meter 110. The distribution transformer DT is not limited, however, to 240/120-volt systems and may, in some embodiments, be configured for a 480-volt system, among other systems. Moreover, a three-phase system, which may have four wires (including one neutral wire) may be fed from the low-voltage secondary side to the meter 110.

The meter 110 (and/or the distribution transformer DT) may be communicatively coupled to an office/data center 130 of an electric utility via a communication network 115. For example, the communication network 115 may comprise a wireless network, such as a cellular (e.g., 3G/4G/5G/LTE, other cellular) network and/or a wireless mesh network. Accordingly, the meter 110 (and/or the distribution transformer DT) may communicate wirelessly with the office/data center 130, which may comprise a head end H of the electric utility, via the communication network 115. Additionally or alternatively, the meter 110 may communicate wirelessly, via the communication network 115, with an electronic device 400 (FIGS. 4A-4C) of the customer who is associated with the customer premise 120.

Figure 1B:
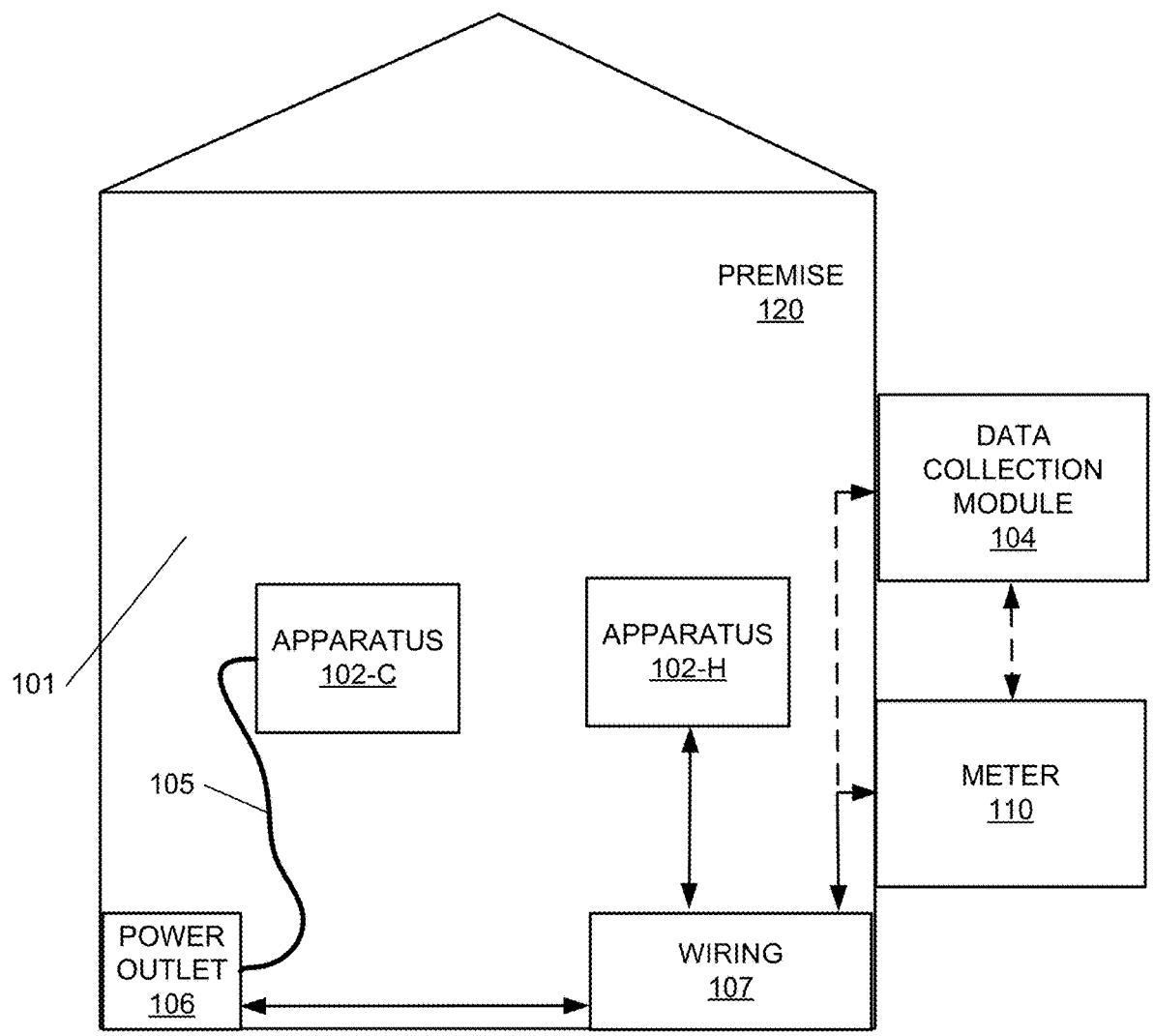
FIG. 1B is a schematic illustration of the customer premise of FIG. 1A.

FIG. 1B is a schematic illustration of a customer premise 120. Multiple apparatuses 102 at the customer premise 120 may be coupled to an electric utility meter 110 by wiring 107. For example, an apparatus 102-C that is inside an interior region 101 of the customer premise 120 may be coupled to the wiring 107 via a power outlet 106 and a power cord 105. Opposite ends of the power cord 105 may be connected to (e.g., plugged into or otherwise attached to) the power outlet 106 and the apparatus 102-C, respectively. Moreover, another apparatus 102-H that is inside the interior region 101 of the customer premise 120 may be hardwired into the wiring 107 without using a power cord therebetween.

The apparatuses 102 may be examples of AC loads A (FIG. 1A). For example, the apparatus 102-C may be an electrical appliance, such as a refrigerator, a microwave oven, a toaster, a washing machine, or a clothes dryer. As another example, the apparatus 102-C may be an electronic device, such as an EV (or an EV charger/power adapter), a television, a smartphone (or a charging device thereof), a laptop computer, a tablet computer, a desktop computer, or a computer server. Moreover, the apparatus 102-H, which is a hardwired electrical appliance or system, may be an AC load A, such as an HVAC system, a water heater, a dishwasher, a garbage disposal, or a stove, or may be a distributed energy resource DER (FIG. 1A), such as a solar battery storage or an EV charger. Another example of an AC load A is a robot, such as a household (e.g., vacuum) robot or a yard (e.g., lawn-mowing) robot, that may be an apparatus 102-C or an apparatus 102-H.

In some embodiments, the wiring 107 may carry 110-130 volts and/or 220-260 volts. Accordingly, the power outlet 106 may nominally be a 120-volt outlet or a 240-volt outlet. As an example, the customer premise 120 may comprise a residence of a customer of an electric utility, and the wiring 107 may be inside walls of the residence. Alternatively, the wiring 107 may carry 300 volts or higher (e.g., 480 volts), such as in a commercial or industrial setting.

For simplicity of illustration, one apparatus 102-C and one apparatus 102-H are shown in FIG. 1B. A plurality of apparatuses 102-C at the customer premise 120, however, may be connected to the wiring 107 via a plurality of power cords 105, respectively. Moreover, a plurality of apparatuses 102-H at the customer premise 120 may be hardwired into the wiring 107.

The wiring 107 may be used to transmit data to the meter 110 and/or to a data collection module 104 that is adjacent the meter 110. For example, data regarding electrical energy consumption (e.g., electricity usage) by each apparatus 102 may be transmitted to the meter 110, and/or to the data collection module 104, via the wiring 107. Such communications may be PLC communications, which are also known as "power-line carrier" communications. In particular, each power cord 105 and each hardwired apparatus 102-H may have a PLC interface that is configured to communicate via the wiring 107. Examples of PLC specifications include the HomePlug AV2 specification and the G3 specification. PLC communications described herein, however, are not limited to such specifications. In some embodiments, the data collection module 104 may be omitted, as its functionality may be incorporated into the meter 110.

Figure 1C:
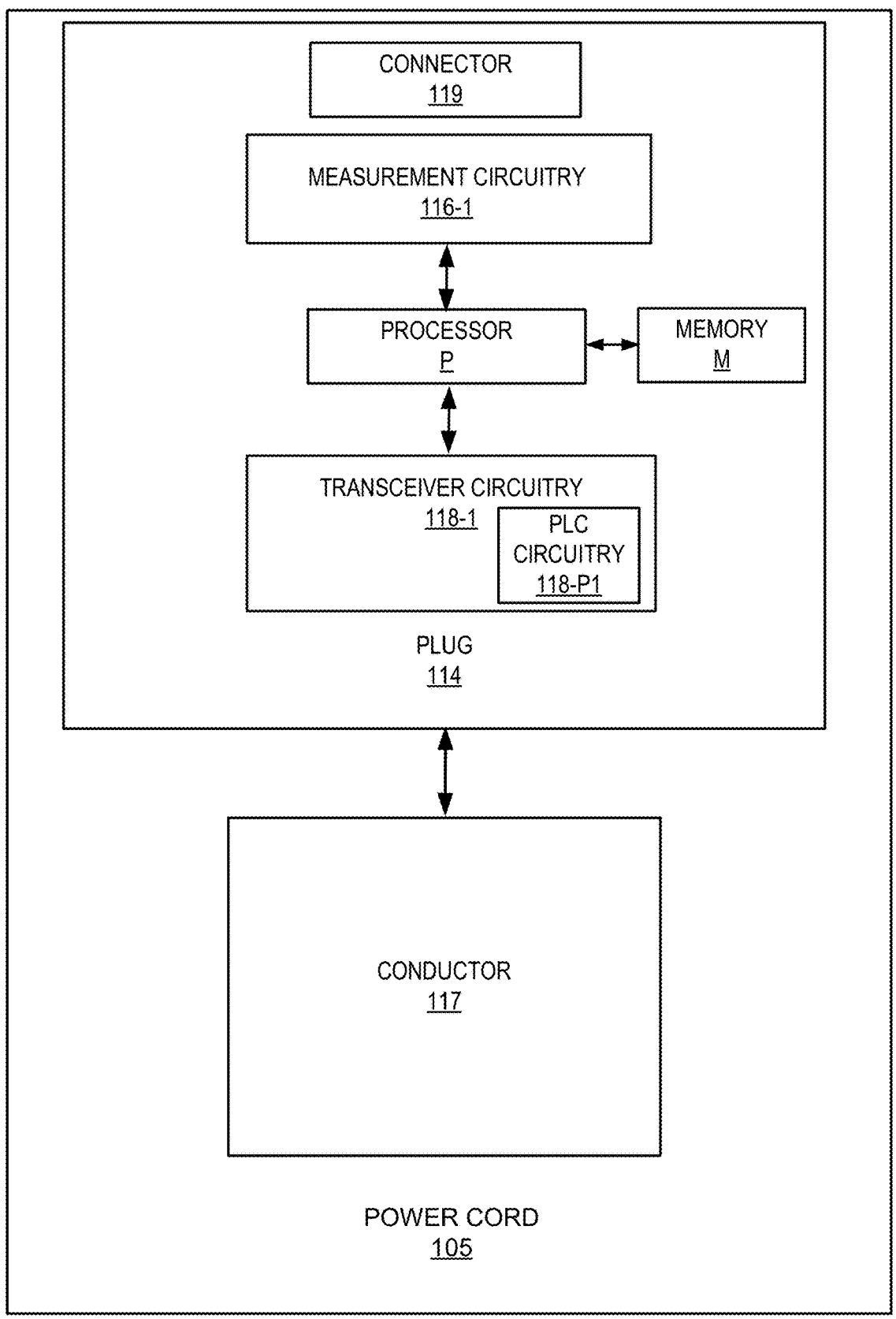
FIG. 1C is a block diagram of a power cord of FIG. 1B that is configured to measure and report electrical energy consumption.

FIG. 1C is a block diagram of a power cord 105 that is configured to measure and report electrical energy consumption. As shown in FIG. 1C, the power cord 105 may include measurement circuitry 116-1 and transceiver circuitry 118-1. The measurement circuitry 116-1 may be configured to measure electrical energy consumption by an apparatus 102-C (FIG. 1B) that is connected to (i.e., that receives electricity via) the power cord 105. As an example, the measurement circuitry 116-1 may comprise wattmeter circuitry, such as power/current transducer circuitry. The transceiver circuitry 118-1 may be configured to transmit data regarding the measured electrical energy consumption to transceiver circuitry 118-3 (FIG. 1E), and/or transceiver circuitry 118-4 (FIG. 1F), that is spaced apart from the power cord 105. For example, the transceiver circuitry 118-1 may comprise wired communications circuitry, such as PLC circuitry 118-P1.

The transceiver circuitry 118-1 and the measurement circuitry 116-1 may be in separate integrated circuits ("ICs"), respectively. In some embodiments, the transceiver circuitry 118-1 and/or the measurement circuitry 116-1 may operate under the control of an external processor P, which may be connected to an external memory M. Additionally or alternatively, the transceiver circuitry 118-1 and/or the measurement circuitry 116-1 may include built-in processor circuitry and/or built-in memory circuitry. As used herein with respect to circuitry, the term "built-in" refers to different types of circuitry that are part of the same IC, and the term "external" refers to different types of circuitry that are part of separate ICs, such as separate chips.

The transceiver circuitry 118-1 and the measurement circuitry 116-1 may be inside a plug 114 that is on an end of the power cord 105. An opposite end of the power cord 105 may be attached/attachable to the apparatus 102-C. The plug 114 may have a connector portion 119 (e.g., conductive prongs) that can be plugged into a power outlet 106 (FIG. 1B). The connector portion 119 is electrically connected to one or more metal (e.g., copper) wire conductors 117 of the power cord 105. The wire conductor(s) 117 may also be electrically connected to the measurement circuitry 116-1, to facilitate measurement of electrical energy consumption.

The power cord 105 may be free of any switching device (or load control), such as a solid-state relay. Moreover, the power cord 105 may be free of Wi-Fi circuitry. The absence of a solid-state relay may help to maintain a relatively small size of the power cord 105. It may also increase the reliability of the power cord 105, as the presence of a relay provides a possible failure point. Similarly, the absence of Wi-Fi circuitry may provide more reliable communications via the power cord 105, as Wi-Fi communications may be unreliable or unavailable in some locations where the power cord 105 is used. By contrast, due to their reliance on wiring 107 (FIG. 1B) rather than wireless communications, PLC communications may operate reliably in locations where Wi-Fi communications are difficult or non-existent.

Figure 1D:
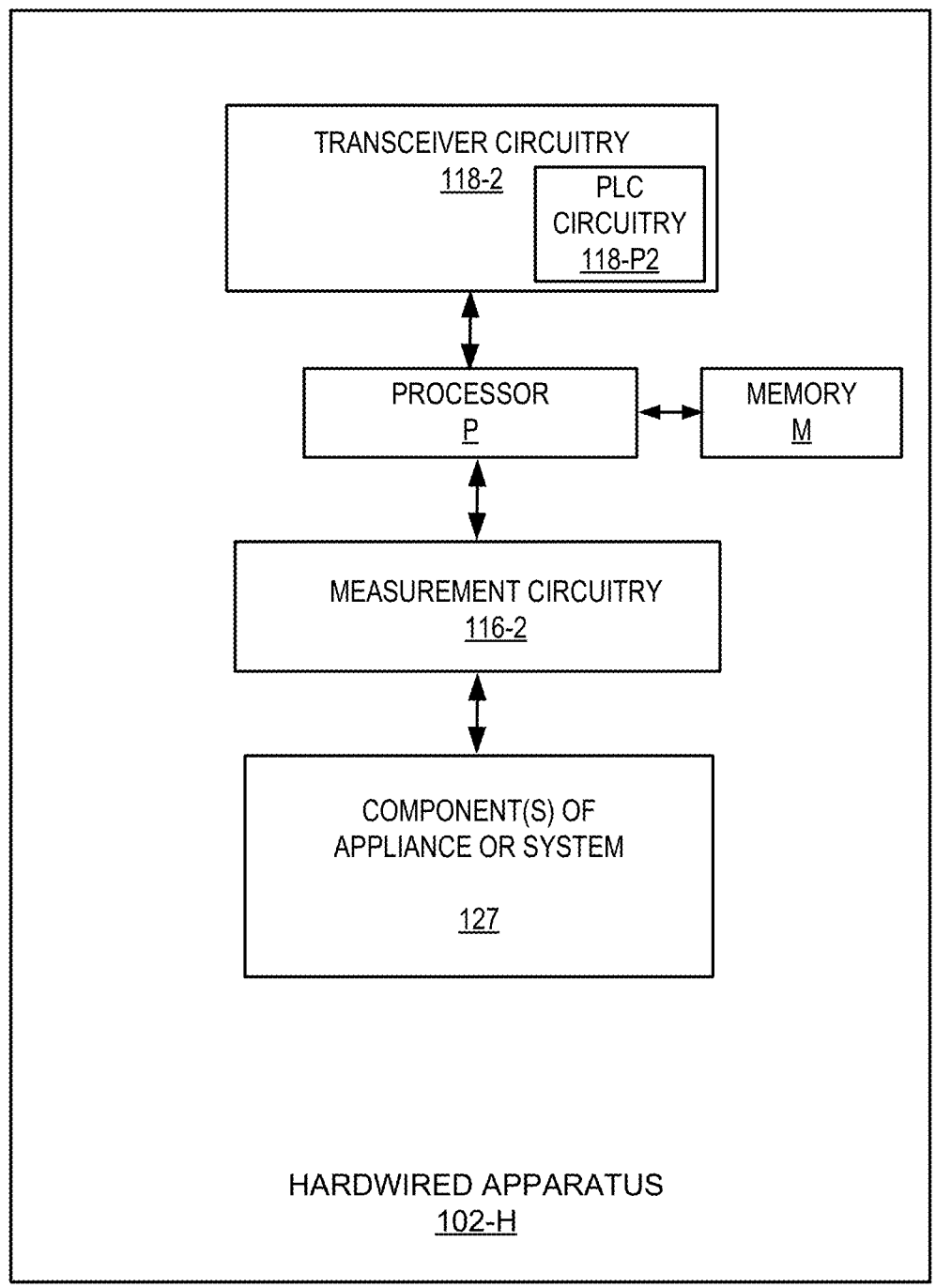
FIG. 1D is a block diagram of a hardwired apparatus of FIG. 1B that is configured to measure and report electrical energy consumption.

FIG. 1D is a block diagram of a hardwired apparatus 102-H that is configured to measure and report electrical energy consumption. The hardwired apparatus 102-H may include measurement circuitry 116-2 and transceiver circuitry 118-2, which may be configured to operate analogously to measurement circuitry 116-1 and transceiver circuitry 118-1, respectively, of a power cord 105 (FIG. 1C). For example, the measurement circuitry 116-2 may include wattmeter circuitry that is configured to measure electrical energy consumption by the hardwired apparatus 102-H. The transceiver circuitry 118-2 may be configured to transmit data regarding the measured electrical energy consumption to transceiver circuitry 118-3 (FIG. 1E), and/or transceiver circuitry 118-4 (FIG. 1F), that is spaced apart from the hardwired apparatus 102-H. As an example, the transceiver circuitry 118-2 may comprise wired communications circuitry, such as PLC circuitry 118-P2.

The hardwired apparatus 102-H is a hardwired electrical appliance or system, and thus includes one or more components 127 thereof, such as a motor, a pump, and/or a heating element, that consume electrical energy. Accordingly, the measurement circuitry 116-2 may be configured to measure electrical energy consumption by the component(s) 127. Though the hardwired apparatus 102-H is configured to measure its own electrical energy consumption, the hardwired apparatus 102-H is not an electric utility meter. Rather, the conventional purpose of the hardwired apparatus 102-H is to use the component(s) 127. As such, the hardwired apparatus 102-H may not measure electrical energy consumption by other apparatuses 102.

Figure 1E:
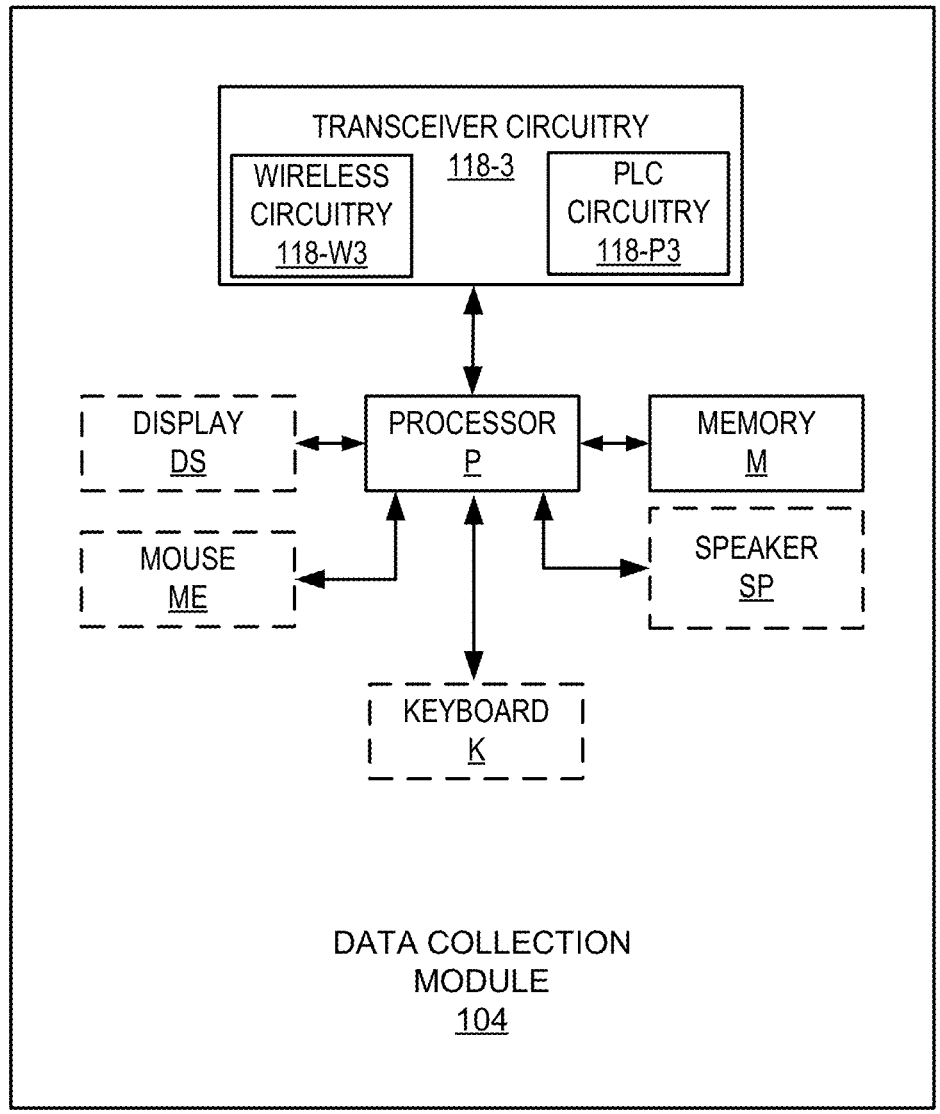
FIG. 1E is a block diagram of a data collection module of FIG. 1B that is configured to receive reports of electrical energy consumption.

FIG. 1E is a block diagram of a data collection module 104 that is configured to receive reports of electrical energy consumption. The data collection module 104 may include a processor P and a memory M. The data collection module 104 may also include transceiver circuitry 118-3 and input/output interface(s), such as a display screen DS, a mouse ME, a keyboard (or keypad) K, and/or a speaker SP. The input/output interface(s) may be configured to receive user inputs from a user and/or to display data to the user. In some embodiments, the display screen DS may comprise a touchscreen display.

The processor P may be coupled to the transceiver circuitry 118-3. The processor P may be configured to communicate with an electric utility meter 110 (FIG. 1B) via the transceiver circuitry 118-3. For example, the transceiver circuitry 118-3 may include wireless communications circuitry 118-W3. The wireless communications circuitry 118-W3 may include short-range wireless communications circuitry, such as Wi-Fi circuitry and/or BLUETOOTH® circuitry. Additionally or alternatively, the wireless communications circuitry 118-W3 may include cellular communications circuitry that provides a cellular wireless interface (e.g., 4G/5G/LTE, other cellular) and/or circuitry that provides a wireless mesh network interface. Moreover, the transceiver circuitry 118-3 may include wired communications circuitry, such as PLC circuitry 118-P3. Accordingly, the data collection module 104 may communicate, via its PLC circuitry 118-P3, with PLC circuitry 118-P1 of a power cord 105 (FIG. 1C) and/or with PLC circuitry 118-P2 of a hardwired apparatus 102-H (FIG. 1D). The data collection module 104 may also communicate with the meter 110 via the wireless communications circuitry 118-W3 or via a wired (e.g., fiber, PLC, Universal Serial Bus ("USB"), or wired Ethernet) connection. In some embodiments, the data collection module 104 may use the wireless communications circuitry 118-W3 or a wired connection to communicate via a communication network 115 (e.g., to upload data to the cloud).

Figure 1F:
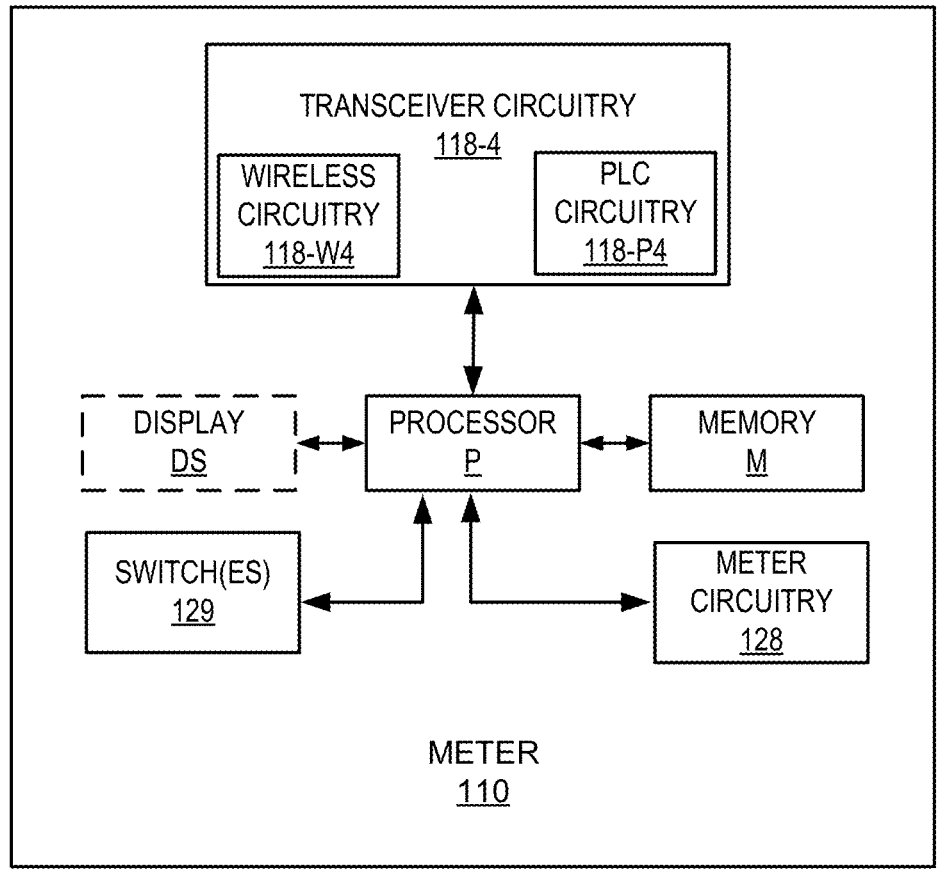
FIG. 1F is a block diagram of an electric utility meter of FIG. 1B.

FIG. 1F is a block diagram of an electric utility meter 110 that is configured to communicate with a data collection module 104 (FIG. 1E), a power cord 105 (FIG. 1C), and/or a hardwired apparatus 102-H (FIG. 1D). In some embodiments, the meter 110 may be a smart meter, such as a single-phase or poly-phase Advanced Metering Infrastructure ("AMI") meter. Accordingly, similar to the data collection module 104, the meter 110 may include a processor P, a memory M, and transceiver circuitry 118-4. The meter 110 also includes meter circuitry 128 that is configured to measure one or more electrical parameters, such as voltage, power delivered to a customer premise 120 (FIG. 1A), and/or power received by an electric utility from the customer premise 120. In some embodiments, the meter 110 may further include a display screen DS, which may display one or more electrical parameters measured by the meter circuitry 128. Additionally or alternatively, the meter 110 may include one or more switches 129 that are configured to connect and/or disconnect power at the customer premise 120.

Analogously to the transceiver circuitry 118-3 of the data collection module 104, the transceiver circuitry 118-4 may include wireless transceiver circuitry 118-W4 and wired communications circuitry, such as PLC circuitry 118-P4. Accordingly, the meter 110 may communicate, via its PLC circuitry 118-P4, with PLC circuitry 118-P1 (FIG. 1C) of the power cord 105 and/or with PLC circuitry 118-P2 (FIG. 1D) of the hardwired apparatus 102-H. In some embodiments, the meter 110 may include a communications bridge that can convert from PLC to non-PLC communications. Moreover, the meter 110 may forward data, via its PLC circuitry 118-P4, to other PLC circuitry at a distribution transformer DT (FIG. 1A) and/or a substation 140 (FIG. 1A). The distribution transformer DT or the substation 140 may then upload the data to the cloud via the communication network 115.

The meter 110 may also communicate with the data collection module 104 via the wireless circuitry 118-W4 or via a wired (e.g., fiber, USB, or wired Ethernet) connection. Moreover, the wireless circuitry 118-W4 or a wired connection may be used to upload data to the cloud via the communication network 115.

Figure 1G:
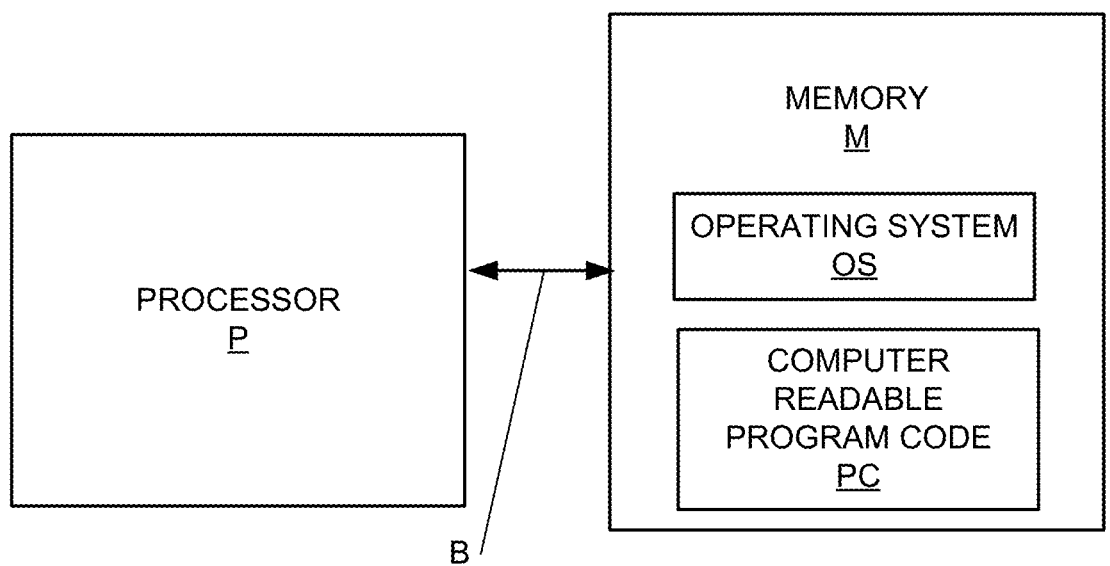
FIG. 1G is a block diagram that illustrates details of an example processor and memory that may be used in accordance with various embodiments.

FIG. 1G is a block diagram that illustrates details of an example processor P and memory M that may be used in accordance with various embodiments. The processor P communicates with the memory M via an address/data bus B. The processor P may be, for example, a commercially available or custom microprocessor. Moreover, the processor P may include multiple processors. The memory M may be a non-transitory computer readable storage medium and may be representative of the overall hierarchy of memory devices containing the software and data used to implement various functions of a power cord 105 (FIG. 1C), a hardwired apparatus 102-H (FIG. 1D), a data collection module 104 (FIG. 1E), or an electric utility meter 110 (FIG. 1F) as described herein. The memory M may include, but is not limited to, the following types of devices: cache, ROM, PROM, EPROM, EEPROM, flash, Static RAM ("SRAM"), and Dynamic RAM ("DRAM").

As shown in FIG. 1G, the memory M may hold various categories of software and data, such as computer readable program code PC and/or an operating system OS. The operating system OS controls operations of a hardwired apparatus 102-H, a data collection module 104, or a meter 110. In some embodiments, the operating system OS may manage the resources of the power cord 105, the hardwired apparatus 102-H, the data collection module 104, or the meter 110 and may coordinate execution of various programs by the processor P. For example, the computer readable program code PC, when executed by a processor P of the power cord 105 or the hardwired apparatus 102-H, may cause the processor P to perform any of the operations illustrated in the flowchart of FIG. 2A. As another example, the computer readable program code PC, when executed by a processor P of the data collection module 104 or the meter 110, may cause the processor P to perform any of the operations illustrated in the flowchart of FIG. 2B.

Figure 2A:
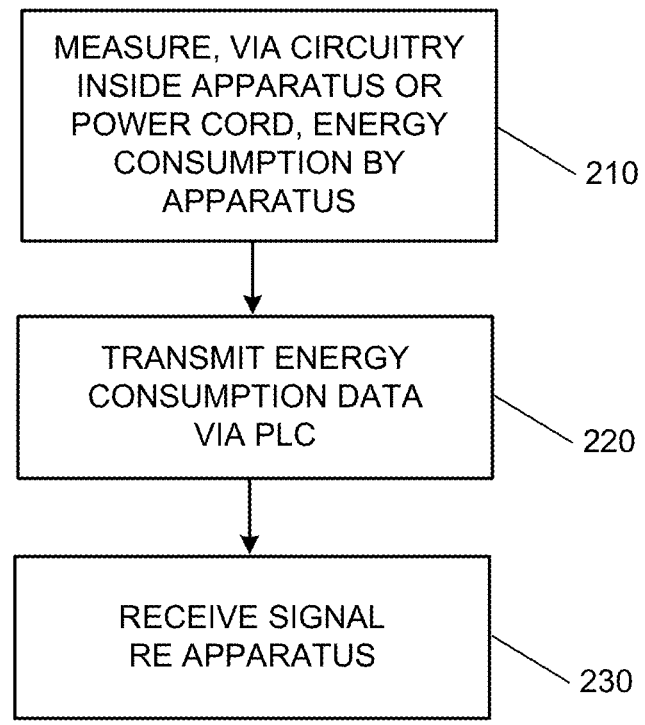
FIG. 2A is a flowchart of operations of measuring and reporting electrical energy consumption, according to embodiments of the present inventive concepts.

FIG. 2A is a flowchart of operations of measuring and reporting electrical energy consumption, according to embodiments of the present inventive concepts. The operations may be performed by a power cord 105 (FIG. 1C) or a hardwired apparatus 102-H (FIG. 1D). The operations include measuring (Block 210), via measurement circuitry 116 (FIG. 1C or FIG. 1D), electrical energy consumption by an apparatus 102 (FIG. 1B). For example, the measurement circuitry 116 may be measurement circuitry 116-1 that is inside a plug 114 (FIG. 1C) of the power cord 105, which may be connected to the apparatus 102. Alternatively, the measurement circuitry 116 may be measurement circuitry 116-2 (FIG. 1D) that is inside the apparatus 102.

The operations also include transmitting (Block 220), via a PLC connection, data regarding the measured electrical energy consumption to transceiver circuitry 118 (FIGS. 1E and/or 1F) that is spaced apart from the apparatus 102. The PLC connection may include wiring 107 (FIG. 1B), and the transmission via the PLC connection may be performed (i) by PLC circuitry 118-P1 (FIG. 1C) that is inside the plug 114 of the power cord 105 (and/or inside a portion of the power cord 105 that includes wire conductor(s) 117 (FIG. 1C) and that is adjacent the plug 114) or (ii) by PLC circuitry 118-P2 (FIG. 1D) that is inside the apparatus 102.

The transceiver circuitry 118 that is spaced apart from the apparatus 102 may include PLC circuitry 118-P4 (FIG. 1F) that is inside an electric utility meter 110 of a customer premise 120 (FIG. 1B) where the apparatus 102 is located. Additionally or alternatively, the transceiver circuitry 118 may include PLC circuitry 118-P3 (FIG. 1E) that is adjacent the meter 110. For example, the PLC circuitry 118-P3 may be inside a data collection module 104 (FIG. 1B) that is adjacent the meter 110.

In some embodiments, the operations may include receiving (Block 230) a signal regarding the apparatus 102 via a communication network 115 (FIG. 1A) and/or via the PLC connection. For example, in response to the data regarding the measured electrical energy consumption by the apparatus 102, the data collection module 104 or the meter 110 may transmit a signal comprising a recommendation to turn off the apparatus 102. As an example, the signal may be transmitted to an electronic device 400 (FIG. 4B) of a customer via the communication network 115 and/or may be sent to the apparatus 102 via a PLC connection. Moreover, in some embodiments, the apparatus 102 may respond to the signal by entering a power-saving mode that reduces electrical energy consumption by the apparatus 102 while still allowing the apparatus 102 to perform one or more of its primary functions. In particular, instead of having a voltage to the apparatus 102 reduced by circuitry inside the power cord 105, the apparatus 102 may control the management/trimming of power.

Figure 2B:
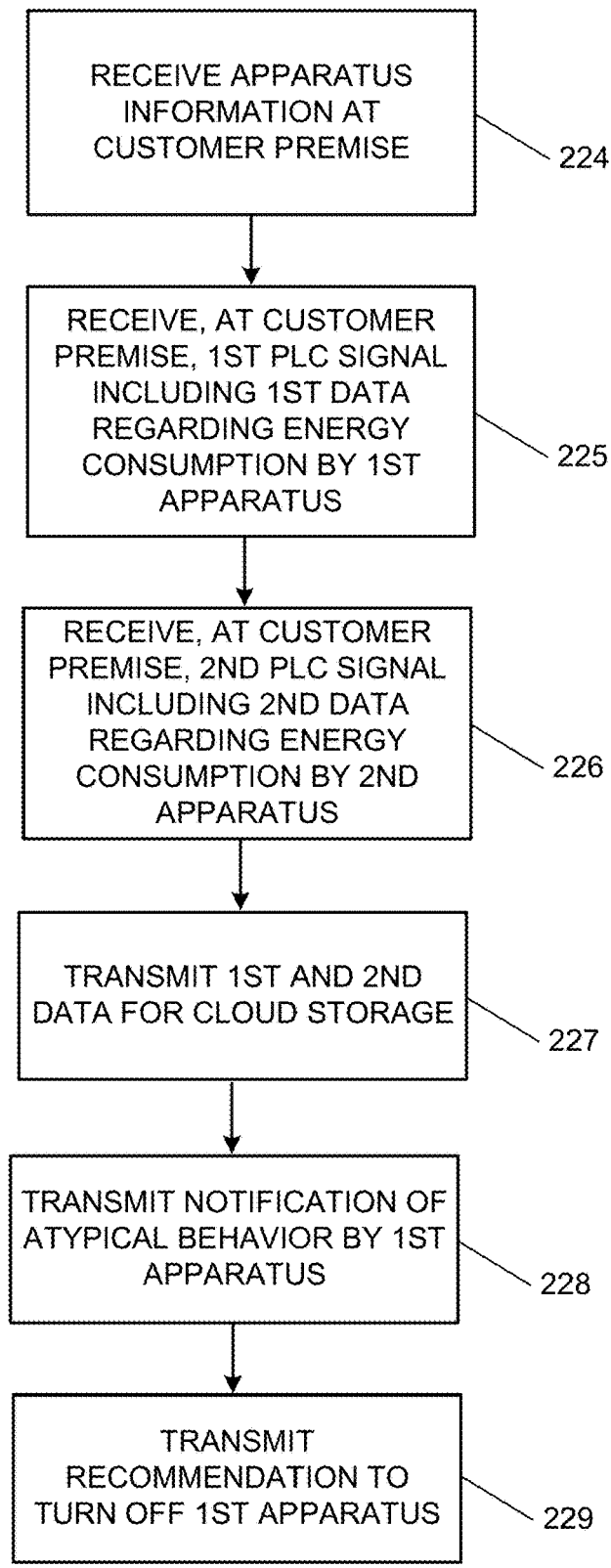
FIG. 2B is a flowchart of operations of receiving reports of electrical energy consumption, according to embodiments of the present inventive concepts.

FIG. 2B is a flowchart of operations of receiving reports of electrical energy consumption, according to embodiments of the present inventive concepts. The operations include receiving (Block 225), by transceiver circuitry 118 (FIG. 1E or FIG. 1F) that is at (e.g., attached to the outside of) a customer premise 120 where a first apparatus 102 (FIG. 1B) is located, a first PLC signal comprising first data regarding electrical energy consumption by the first apparatus 102.

Moreover, the operations include receiving (Block 226), by the transceiver circuitry 118, a second PLC signal comprising second data regarding electrical energy consumption by a second apparatus 102 (FIG. 1B) that is at the customer premise 120. Accordingly, multiple PLC signals may be received by the transceiver circuitry 118 from multiple apparatuses 102 (e.g., respective appliances). In some embodiments, the PLC signals may be received concurrently with each other. For example, the transceiver circuitry 118 may concurrently receive PLC signals that include respective identification information (manufacturer information, model number, etc.) from two, three, four, or more appliances.

As the transceiver circuitry 118 can receive individual reports about each apparatus 102, an electric utility meter 110 (FIG. 1F) or data collection module 104 (FIG. 1E) that houses the transceiver circuitry 118 does not need to guess/estimate how much electrical energy consumption to attribute to each apparatus 102. Rather, each report may include an identifier of the corresponding apparatus 102. For example, the identifier may comprise a model number, an indication of a manufacturer, and/or an indication of an apparatus species of the corresponding apparatus 102. In some embodiments, a power cord 105 (FIG. 1B) may receive apparatus-specific information, for identification of the apparatus 102, that the power cord 105 can store as/with firmware and transmit to the electric utility meter 110 or data collection module 104.

The operations shown in FIG. 2B may be performed by the data collection module 104 or the meter 110. Accordingly, the transceiver circuitry 118 may include PLC circuitry 118-P3 (FIG. 1E) that is inside the data collection module 104 or PLC circuitry 118-P4 (FIG. 1F) that is inside the meter 110.

In some embodiments, the transceiver circuitry 118 may be used to respond to the first PLC signal and/or the second PLC signal. For example, the transceiver circuitry 118 may transmit (Block 228) a notification that the first apparatus 102 is behaving atypically, such as operating at a high level of electrical energy consumption that is inconsistent with standard and/or historical operating conditions of the first apparatus 102. As an example, the notification may be sent to an electronic device 400 (FIG. 4B) of the customer via a communication network 115 (FIG. 1A) and/or may be sent to the first apparatus 102 (or a power cord 105 attached thereto) via a PLC connection. The notification may be sent to a customer who is associated with the customer premise 120.

Detection of atypical behavior may be performed locally by the data collection module 104 or the meter 110, or performed remotely by cloud/post-cloud analytics. For example, expected/nominal behavior of the first apparatus 102 may be compared with actual behavior that is indicated by the first PLC signal, and this comparison may be performed at the data collection module 104, the meter 110, or a computer server. The expected/nominal behavior may be indicated in the first PLC signal or may be separately provided to the data collection module 104, meter 110, or computer server that is performing the comparison.

Moreover, the transceiver circuitry 118 may transmit (Block 229) a third PLC signal, or a non-PLC signal, comprising a recommendation to turn off (i.e., power off) the first apparatus 102 or to otherwise convey/trigger a response that has been preapproved by the customer (e.g., an alert or a temperature adjustment). For example, the recommendation may be transmitted to the electronic device 400, to the first apparatus 102, or to the power cord 105 that is attached to the first apparatus 102.

Additionally or alternatively, the transceiver circuitry 118 may be used to forward data to the cloud. In some embodiments, the transceiver circuitry 118 may transmit (Block 227) the first and second data of the first and second PLC signals, respectively, for cloud storage and/or subsequent processing. For example, the meter 110 may use its PLC circuitry 118-P4 to forward the first and second data upstream via power lines of an electric grid 100 (FIG. 1A), such as to a distribution transformer DT (FIG. 1A) and/or to a substation 140 (FIG. 1A), which may then upload the first and second data to the cloud via the communication network 115. As another example, the meter 110 may use its wireless circuitry 118-W4 (FIG. 1F) to upload the first and second data to the cloud via the communication network 115.

In addition to receiving the first and second data, the transceiver circuitry 118 may receive (Block 224) various information about the first apparatus 102 and/or the second apparatus 102. For example, the transceiver circuitry 118 may receive an indication of a manufacturer (and/or a model number or other identifier) of the first apparatus 102 and/or the second apparatus 102. Moreover, the transceiver circuitry 118 may receive an indication of apparatus species (e.g., toaster, refrigerator, etc.) of the first apparatus 102 and/or the second apparatus 102. Such indications may help to distinguish between different apparatuses 102 and to identify atypical behavior. As another example, the transceiver circuitry 118 may receive an indication of a length of time (e.g., total hours over a month or average hours per day) that the first apparatus 102 and/or the second apparatus 102 has been powered-on. In some embodiments, such apparatus information may be included in the first and/or second PLC signals.

Accordingly, operation(s) of receiving (Block 224) apparatus information may be combined with receiving (Block 225) the first PLC signal and/or may be combined with receiving (Block 226) the second PLC signal. Additionally or alternatively, operation(s) of receiving (Block 224) apparatus information may be separate from receiving (Block 225) the first PLC signal and separate from receiving (Block 226) the second PLC signal. For example, apparatus information may be received in one or more PLC signals before or after the first and second PLC signals. Moreover, apparatus information may be received via one or more wireless signals, such as via the communication network 115.

Figure 3:
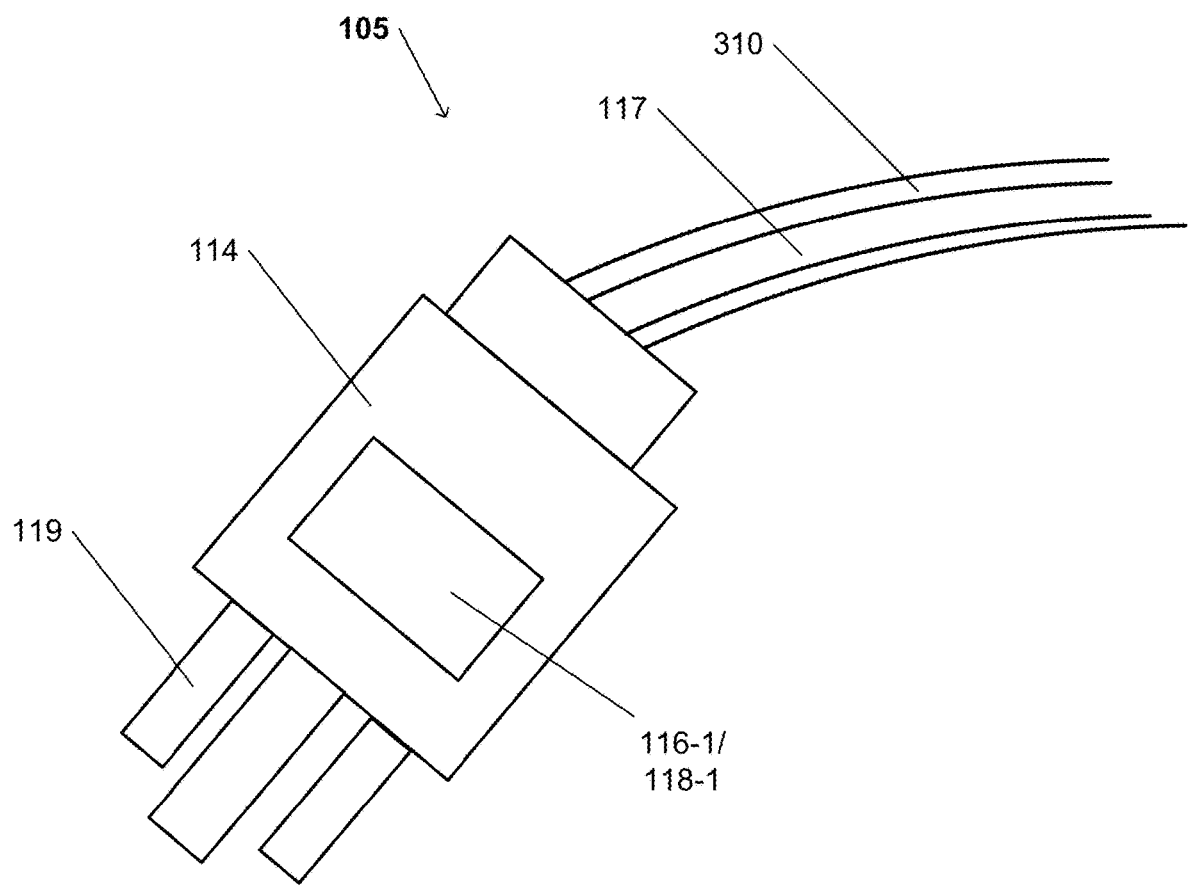
FIG. 3 is a schematic diagram of the power cord of FIG. 1C.

FIG. 3 is a schematic diagram of a power cord 105. As discussed herein with respect to FIG. 1C, a power cord 105 may include one or more wire conductors 117 (that are surrounded by an insulator 310) and a connector portion 119 that is electrically connected to the wire conductor(s) 117. The connector portion 119 is part of a plug 114 of the power cord 105. In some embodiments, the connector portion 119 may include two, three, or more conductive prongs that are electrically connected to the wire conductor(s) 117 and that can be plugged into a power outlet 106 (FIG. 1B). Moreover, the power cord 105 may include measurement circuitry 116-1 and transceiver circuitry 118-1, either (or both) of which may be inside the plug 114 and/or inside a portion of the power cord 105 that is adjacent the plug 114. An end of the power cord 105 that is opposite the connector portion 119 may be attached to an apparatus 102 (FIG. 1B). Alternatively, the power cord 105 may be a short (e.g., one foot) extension cord that is connected between the power outlet 106 and another power cord that is attached to the apparatus 102.

In some embodiments, a voltage can be induced along the length of the wire conductor(s) 117 in the power cord 105. For example, secondary, electrically-insulated conductor(s) 510 (FIGS. 5A-5C) may be wrapped (e.g., coiled) along the length of the wire conductor(s) 117 to induce a voltage for use by electronics (e.g., PLC, etc.) of the power cord 105. The electrically-insulated conductor(s) 510 may comprise insulated wiring, such as enamel-coated wiring. Moreover, the electrically-insulated conductor(s) 510 may be used to detect/measure amperage (current). The voltage and/or current can be used for reporting electrical energy consumption of the apparatus 102.

Figure 4A:
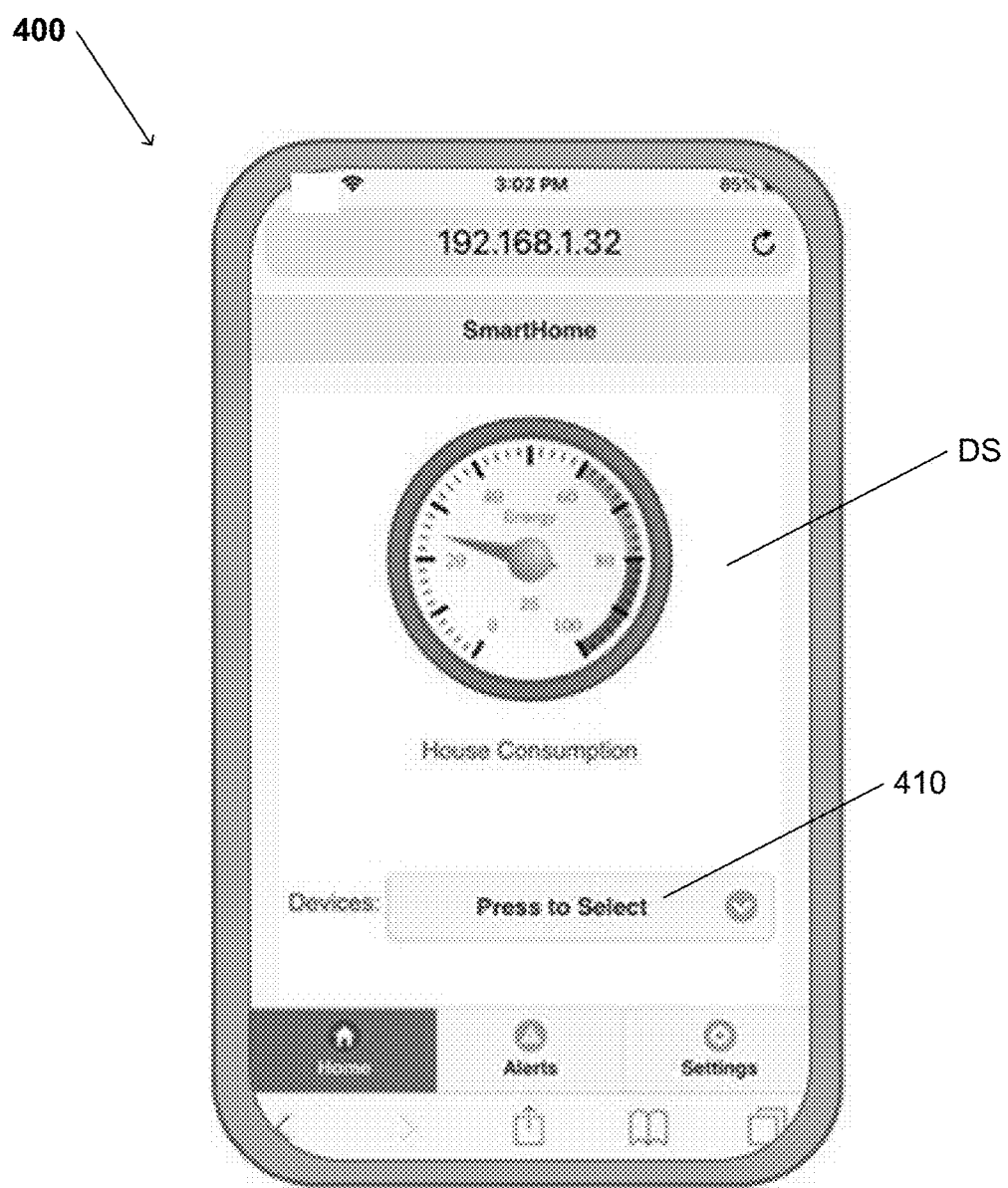
FIGS. 4A to 4C are screenshots of a Graphical User Interface ("GUI") of an electronic device of the customer associated with the customer premise of FIG. 1B.
Figure 4B:
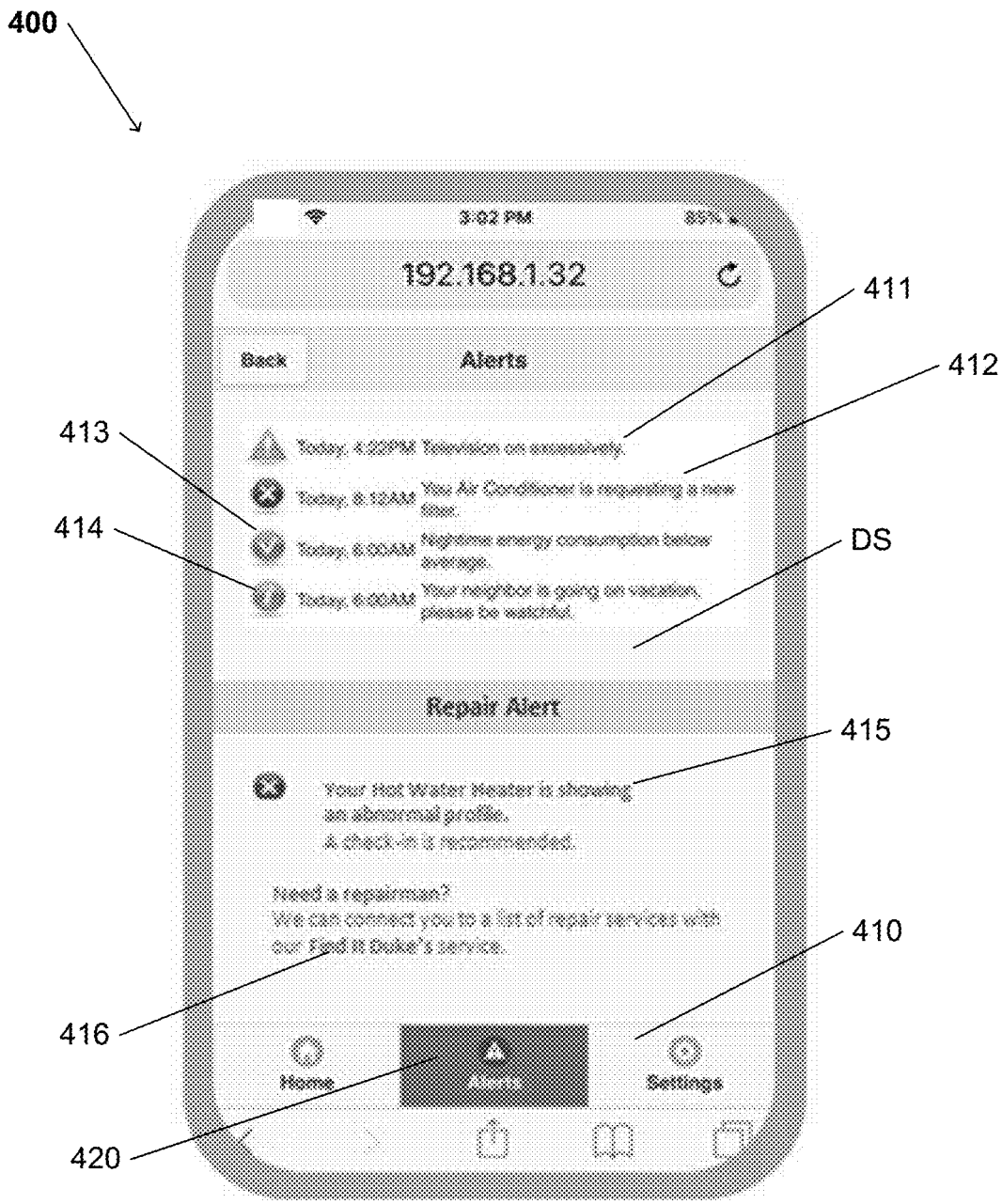
Figure 4C:
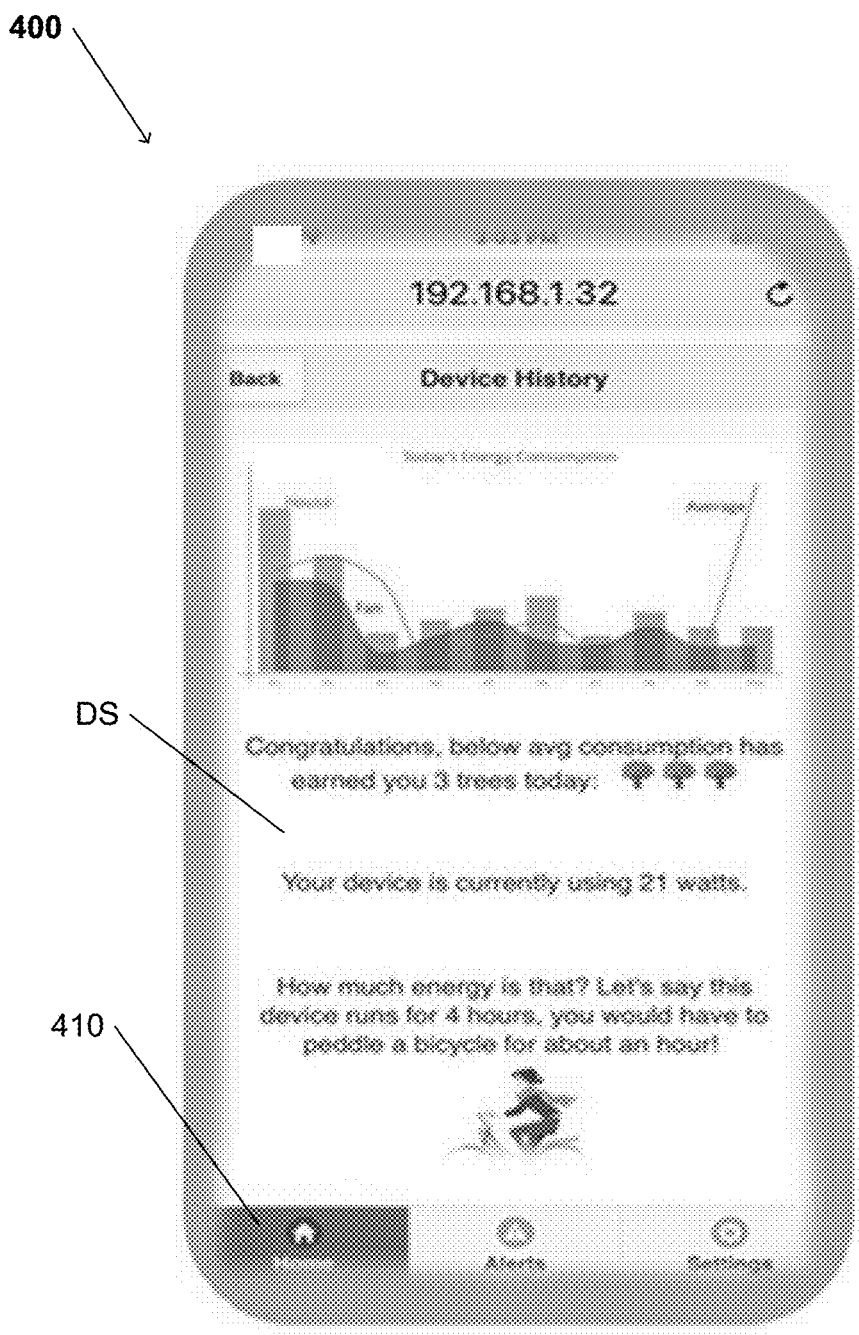

FIGS. 4A to 4C are screenshots of a GUI 410 of an electronic device 400 of a customer associated with a customer premise 120 (FIG. 1B), such as a home of the customer. These screenshots are merely examples, however, and the content therein may be reformatted on the GUI 410 and/or presented to the customer via other digital media (e.g., a digital image or an online portal) or non-digital media. The electronic device 400 may be configured to communicate with an electric utility meter 110 (FIG. 1B), and/or a data collection module 104 (FIG. 1B), via a communication network 115 (FIG. 1A), according to embodiments of the present inventive concepts. For example, the electronic device 400 may be a smartphone, a tablet computer, a laptop computer, or a desktop computer. Accordingly, the electronic device 400 may include components similar to some of those that are shown in FIG. 1E for the data collection module 104. As an example, the electronic device 400 may include transceiver circuitry 118 (e.g., cellular and/or short-range wireless communications circuitry) and a display DS.

In some embodiments, analytics data may be provided to the electronic device 400 from an electric utility via the cloud. For example, raw (e.g., unprocessed, unformatted) data may ultimately be collected by the electric utility for analysis and dissemination. The electric utility may use the communication network 115 to collect the raw data and/or to disseminate processed data (e.g., alerts, recommendations).

Referring to FIG. 4A, the GUI 410 may be displayed on the display screen DS of the electronic device 400. A user, such as the customer, may use the GUI 410 to access a website or software application that displays electrical energy consumption (e.g., in watts or in kilowatt hours ("kWh")) at the customer premise 120. For example, the GUI 410 may display aggregate electrical energy consumption at the customer premise 120. Moreover, the GUI 410 may allow the user to select (e.g., via a list) one or more apparatuses 102 (FIG. 1B) for which individual apparatus electrical energy consumption may be displayed via the GUI 410. In some embodiments, a "Home" tab/screen of an application that is running on the electronic device 400 may display the electrical energy consumption.

Referring to FIG. 4B, a GUI 410 may display one or more notifications of atypical behavior by one or more apparatuses 102 at a customer premise 120. For example, the GUI 410 may display alerts, such as (a) "television on excessively" 411, (b) "air conditioner requesting a new filter" 412, (c) "nighttime energy consumption below average" 413, and/or (d) "neighbor on vacation, please be watchful" 414. Each of the alerts (a)-(d) may be accompanied by a day and time stamp. Moreover, each of the alerts (a)-(d) may be accompanied by an icon (e.g., a positive, negative, or informational icon) that indicates the nature/type of each of the alerts (a)-(d).

In some embodiments, a notification may be a repair alert, such as an indication that a "water heater is showing an abnormal profile" 415. The repair alert may also include a link 416 (e.g., a hyperlink) to repair services that correspond to the notification. Transmission of the repair alert may be triggered by data indicating a potential (or impending) overload/overheat/failure of an apparatus 102. Moreover, notifications may, in some embodiments, be displayed on an "Alerts" tab/screen 420 of an application that is running on the electronic device 400.

Referring to FIG. 4C, a GUI 410 may display a device history of electrical energy consumption by an individual apparatus 102 at a customer premise 120. The device history may include a graphical representation of the consumption by the apparatus 102 throughout a day (or month or other time period). The device history may also include an indication of real-time consumption (e.g., 21 watts) by the apparatus 102. In some embodiments, the device history may be displayed in response to a user selection of the apparatus 102, such as from a list on the "Home" tab/screen that is shown in FIG. 4A.

Moreover, in some embodiments, data presented via the GUI 410 may include a comparison with data from like homes. For example, a comparison of air conditioning consumption among homes in the same neighborhood may be presented to the customer. This may encourage energy-conscious customer behavior, such as setting up a programmable thermostat, pulling window shades, washing clothes in cold water, etc.

The information displayed by the electronic device 400 in FIGS. 4A-4C may be based on one or more signals received via the communication network 115, such as one or more signals transmitted by the meter 110 and/or the data collection module 104. Alternatively, the signal(s) may be transmitted via the communication network 115 by a remote device, such as by a device at an office/data center 130 (FIG. 1A) of an electric utility.

Figure 5A:
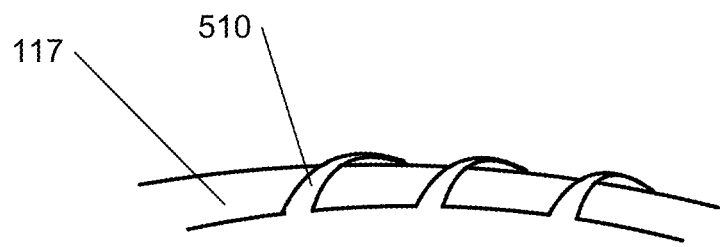
FIGS. 5A to 5C are schematic diagrams of the wire conductor(s) of FIG. 3.
Figure 5B:
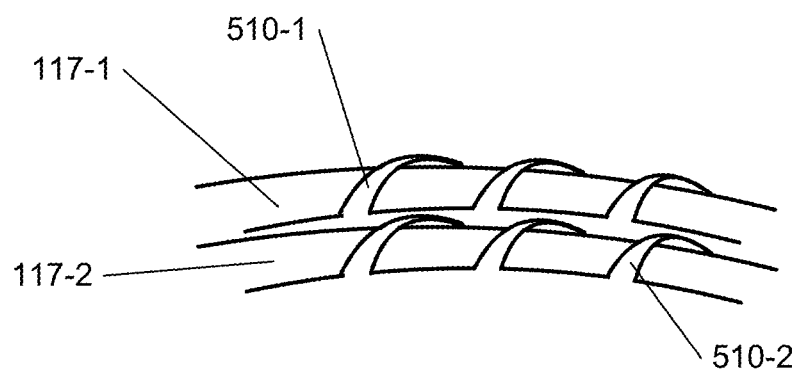
Figure 5C:
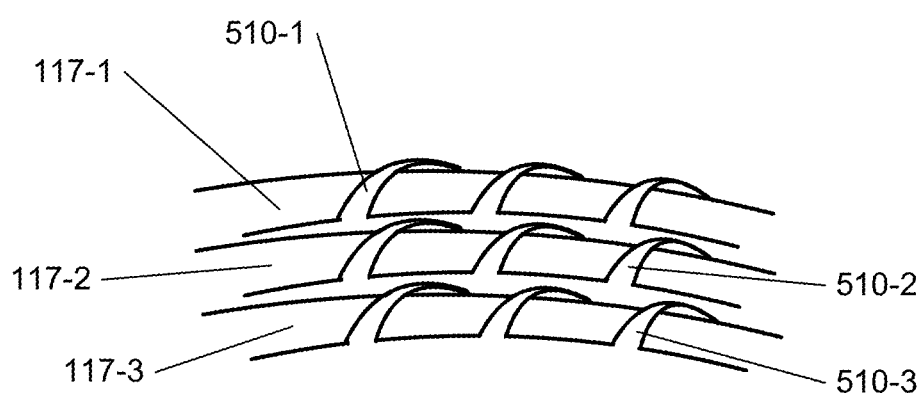

FIGS. 5A to 5C are schematic diagrams of the wire conductor(s) 117 of the power cord 105 of FIG. 3. As shown in FIG. 5A, secondary, electrically-insulated conductor(s) 510 may be wrapped (e.g., coiled) along the length of a single wire conductor 117 to induce a voltage and/or current that can be measured by the power cord 105. Moreover, FIGS. 5B and 5C each show multiple electrically-insulated conductors 510 wrapped around respective wire conductors 117. Specifically, FIG. 5B shows two electrically-insulated conductors 510-1, 510-2 wrapped around two wire conductors 117-1, 117-2, respectively, and FIG. 5C shows three electrically-insulated conductors 510-1, 510-2, 510-3 wrapped around three wire conductors 117-1, 117-2, 117-3, respectively. In some embodiments, a single electrically-insulated conductor 510 may be wrapped along more than half of the length of each wire conductor 117. For example, the electrically-insulated conductor 510 may extend along 3-6 feet of each wire conductor 117. For simplicity of illustration, a neutral wire is omitted from view in FIGS. 5B and 5C.

The electrically-insulated conductor 510 may not be in series with a load (e.g., an appliance) that receives power via the power cord 105, and the electrically-insulated conductor 510 thus may not be a failure point for the load. In some embodiments, the electrically-insulated conductor 510, together with measurement circuitry 116-1 (FIG. 3) coupled thereto, can measure up to 15-20 amps of current, or even more for a hardwired appliance.

Embodiments of the present inventive concepts may provide a number of advantages. These advantages include providing a platform that allows various apparatuses 102 (FIG. 1B) to be communicatively connected to an electric utility meter 110 (FIG. 1B) or a data collection module 104 (FIG. 1B). This platform enables ubiquitous energy monitoring. Once an apparatus 102 is communicatively connected, it can transmit data about its operating conditions (including electrical energy consumption) and may receive a remote command/recommendation to shut down, enter a power-saving mode, or otherwise adjust its operation. For example, a customer of an electric utility may receive an alert that gives the customer a choice for responding to an incident.

In some embodiments, a generated signal/command may be provided directly to the apparatus 102 via a standard protocol for adjusting/switching. For example, a particular power cord 105 (FIG. 1C) may be the only carrier for the signal/command. Alternatively, a recommendation may be sent to an electronic device 400 (FIG. 4B) of a customer of an electric utility.

Moreover, the platform may require zero configuration (e.g., installation/setup) by a customer of an electric utility or by an electrician. For example, a hardwired apparatus 102-H (FIG. 1B), such as a furnace (or another component of an HVAC system), at a customer premise 120 (FIG. 1B) can communicate its need for a filter change via PLC to the meter 110 and/or the data collection module 104, which can then transmit a notification of the needed filter change via a communication network 115 (FIG. 1A) to an electronic device 400 of a customer associated with the customer premise 120. As the furnace may include PLC circuitry 118-P2 (FIG. 1D) therein at the time of its assembly/manufacture, the customer may not have to configure the furnace to perform PLC communications. Also, as the furnace is permanently installed at the customer premise 120, a sale of the customer premise 120 from one owner to another owner will not prevent the furnace from performing PLC communications at the customer premise 120.

Another example of zero configuration is a power cord 105 that is manufactured with measurement circuitry 116-1 and transceiver circuitry 118-1 therein. Over time, a large number of power cords 105 and hardwired apparatuses 102-H may be manufactured with measurement circuitry 116 and transceiver circuitry 118 therein, thus providing a universal and standardized way to collect data across various plug loads and hardwired devices.

Also, the present inventive concepts advantageously provide data transfers, with respect to connected apparatuses, that are not Wi-Fi dependent. Rather, data transfers using embedded transceiver circuitry 118-1 or 118-2 (FIG. 1D) may be performed exclusively via PLC, which may enable reliable transfers of real-time data measured by adjacent embedded measurement circuitry 116.

Moreover, the transceiver circuitry 118 and the measurement circuitry 116 are advantageously non-invasive, in that they do not require installation by an electrician. Also, the power cord 105 may not include any embedded switching devices, which pose a risk of failure.

The present inventive concepts have been described above with reference to the accompanying drawings. The present inventive concepts are not limited to the illustrated embodiments. Rather, these embodiments are intended to fully and completely disclose the present inventive concepts to those skilled in this art. In the drawings, like numbers refer to like elements throughout. Thicknesses and dimensions of some components may be exaggerated for clarity.

Spatially relative terms, such as "under," "below," "lower," "over," "upper," "top," "bottom," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the example term "under" can encompass both an orientation of over and under. The device may be otherwise oriented (rotated 90 degrees or at other orientations) and the spatially relative descriptors used herein interpreted accordingly.

Herein, the terms "attached," "connected," "interconnected," "contacting," "mounted," and the like can mean either direct or indirect attachment or contact between elements, unless stated otherwise.

Well-known functions or constructions may not be described in detail for brevity and/or clarity. As used herein the expression "and/or" includes any and all combinations of one or more of the associated listed items.

The terminology used herein is for the purpose of describing particular embodiments only and is not intended to be limiting of the present inventive concepts. As used herein, the singular forms "a," "an," and "the" are intended to include the plural forms as well, unless the context clearly indicates otherwise. It will be further understood that the terms "comprises," "comprising," "includes," and/or "including" when used in this specification, specify the presence of stated features, operations, elements, and/or components, but do not preclude the presence or addition of one or more other features, operations, elements, components, and/or groups thereof.

It will also be understood that although the terms "first" and "second" may be used herein to describe various elements, these elements should not be limited by these terms. These terms are only used to distinguish one element from another element. Thus, a first element could be termed a second element, and similarly, a second element may be termed a first element without departing from the teachings of present inventive concepts.

Example embodiments of the present inventive concepts may be embodied as nodes, devices, apparatuses, and methods. Accordingly, example embodiments of present inventive concepts may be embodied in hardware and/or in software (including firmware, resident software, microcode, etc.). Furthermore, example embodiments of present inventive concepts may take the form of a computer program product comprising a non-transitory computer-usable or computer-readable storage medium having computer-usable or computer-readable program code embodied in the medium for use by or in connection with an instruction execution system. In the context of this document, a computer-usable or computer-readable medium may be any medium that can contain, store, communicate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, or device. More specific examples (a nonexhaustive list) of the computer-readable medium would include the following: an electrical connection having one or more wires, a portable computer diskette, a random access memory ("RAM"), a read-only memory ("ROM"), an erasable programmable read-only memory ("EPROM" or Flash memory), an optical fiber, and a portable compact disc read-only memory ("CD-ROM"). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Example embodiments of present inventive concepts are described herein with reference to flowchart and/or block diagram illustrations. It will be understood that each block of the flowchart and/or block diagram illustrations, and combinations of blocks in the flowchart and/or block diagram illustrations, may be implemented by computer program instructions and/or hardware operations. These computer program instructions may be provided to a processor of a general purpose computer, a special purpose computer, or other programmable data processing apparatus to produce a machine, such that the instructions, which execute via the processor of the computer or other programmable data processing apparatus, create/use circuits for implementing the functions specified in the flowchart and/or block diagram block or blocks.

These computer program instructions may also be stored in a computer usable or computer-readable memory that may direct a computer or other programmable data processing apparatus to function in a particular manner, such that the instructions stored in the computer usable or computer-readable memory produce an article of manufacture including instructions that implement the functions specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the flowchart and/or block diagram block or blocks.

The invention claimed is:

1. A power cord comprising:
   a plurality of wire conductors having respective opposite first and second ends, wherein the first ends of the plurality of wire conductors are directly connected to an apparatus;
   a plug directly connected to the second ends of the plurality of wire conductors, the plug comprising a plurality of conductive prongs configured to be plugged into a power outlet;
   measurement circuitry configured to measure electrical energy consumption by the apparatus, the measurement circuitry comprising a secondary conductor coiled around a portion of one of the plurality of wire conductors, wherein the portion is at least half a length of the one of the plurality of wire conductors, and wherein the secondary conductor induces a voltage and current that can be measured by the measurement circuitry; and
   first transceiver circuitry configured to transmit data regarding the measured electrical energy consumption to second transceiver circuitry that is spaced apart from the power cord,
   wherein the measurement circuitry and the first transceiver circuitry are inside the plug and/or inside a portion of the power cord that is adjacent the plug.

2. The power cord of claim 1, wherein the first transceiver circuitry comprises first power-line communication (PLC) circuitry, wherein the second transceiver circuitry comprises second PLC circuitry that is inside or adjacent an electric utility meter of a customer premise where the apparatus is located, and wherein the measurement circuitry comprises a wattmeter.

3. The power cord of claim 1, wherein the measurement circuitry comprises a plurality of secondary conductors, each secondary conductor coiled around a respective one of the plurality of wire conductors.

4. The power cord of claim 1, wherein the portion is more than half of the length of the one of the plurality of wire conductors.

5. The power cord of claim 1, wherein the portion is between three and six feet (3-6 ft).

6. The power cord of claim 1, wherein the power cord is free of Wi-Fi circuitry, and wherein the power cord is free of a switching device.

7. The power cord of claim 1, wherein the apparatus is an electrical appliance comprising a refrigerator, a microwave oven, a toaster, a washing machine, or a clothes dryer.

8. The power cord of claim 1, wherein the apparatus is an electronic device comprising an electric vehicle, a television, a smartphone, a laptop computer, a tablet computer, a desktop computer, or a computer server.

9. The power cord of claim 1, wherein the power cord is a built-in power cord of the apparatus.

10. An electrical appliance or system comprising:
    measurement circuitry that is inside the hardwired electrical appliance or system and configured to measure electrical energy consumption by the hardwired electrical appliance or system; and
    first transceiver circuitry configured to transmit data regarding the measured electrical energy consumption to second transceiver circuitry that is spaced apart from the hardwired electrical appliance or system,
    wherein the electrical appliance or system is hardwired to electrical wiring of a customer premise without the use of a power cord and without the use of a power outlet or socket connected to the electrical wiring of the customer premise, and
    wherein the measurement circuitry comprises a secondary conductor coiled around a portion of a wire conductor connected to the electrical wiring, wherein the portion is at least half a length of the wire conductor, and wherein the secondary conductor induces a voltage and current that can be measured by the measurement circuitry.

11. The hardwired electrical appliance or system of claim 10, wherein the hardwired electrical appliance or system is a heating, ventilation, and air conditioning (HVAC) system, a solar battery storage, an electric vehicle charger, a water heater, a dishwasher, a garbage disposal, a stove, a ceiling fan, or a light fixture.

12. The hardwired electrical appliance or system of claim 10, wherein the first transceiver circuitry comprises first power-line communication (PLC) circuitry.

13. The hardwired electrical appliance or system of claim 12, wherein the second transceiver circuitry comprises second PLC circuitry that is inside or adjacent an electric utility meter of a customer premise where the hardwired electrical appliance or system is located.

14. The hardwired electrical appliance or system of claim 10, wherein the hardwired electrical appliance or system is not an electric utility meter.

15. A method comprising:
    measuring, via measurement circuitry that is inside an apparatus or that is inside a power cord that is connected to the apparatus, electrical energy consumption by the apparatus, wherein the power cord comprises a plurality of wire conductors, and wherein the measurement circuitry comprises a secondary conductor coiled around a portion of one of the plurality of wire conductors, wherein the portion is at least half a length of the one of the plurality of wire conductors, and wherein the secondary conductor induces a voltage and current that can be measured by the measurement circuitry to determine the electrical energy consumption; and
    transmitting, via a power-line communication (PLC) connection, data regarding the measured electrical energy consumption to transceiver circuitry that is spaced apart from the apparatus.

16. The method of claim 15, wherein the transceiver circuitry comprises PLC circuitry that is inside or adjacent an electric utility meter of a customer premise where the apparatus is located.

17. The method of claim 15, wherein the transmitting is performed via PLC circuitry that is inside a plug of the power cord and/or inside a portion of the power cord that is adjacent the plug.

18. The method of claim 17, wherein the power cord is free of a switching device.

19. The method of claim 15,
wherein the apparatus is a hardwired electrical appliance or system, and
wherein the transmitting is performed via PLC circuitry that is inside the hardwired electrical appliance or system.

20. The method of claim 15, wherein the apparatus is not an electric utility meter.

21. The method of claim 15, wherein the measuring and the transmitting are performed in a household, institutional, commercial, or industrial setting.

22. A method comprising:
receiving, by transceiver circuitry, a first power-line communication (PLC) signal comprising first data regarding electrical energy consumption by a first apparatus that is at a customer premise, wherein the first apparatus is connected to a power outlet by a first power cord, wherein the first power cord generates the first PLC signal, and wherein the first PLC signal further comprises manufacturer and model information for the first apparatus that is stored in the first power cord;
receiving, by the transceiver circuitry, a second PLC signal comprising second data regarding electrical energy consumption by a second apparatus that is at the customer premise, wherein the second apparatus is connected to a power outlet by a second power cord, wherein the second power cord generates the second PLC signal, and wherein the second PLC signal further comprises manufacturer and model information for the second apparatus that is stored in the second power cord,
wherein the transceiver circuitry comprises PLC circuitry that is inside or adjacent an electric utility meter of the customer premise; and
transmitting the first and second data from the transceiver circuitry for cloud storage, comprising forwarding the first and second data upstream from the electric utility meter via power lines of an electric grid to a distribution transformer and/or to a substation, and then uploading the first and second data from the distribution transformer and/or substation to the cloud storage via a communication network.

23. The method of claim 22, further comprising electronically transmitting, to an electric utility customer associated with the customer premise, a notification that the first apparatus is behaving atypically.

24. The method of claim 22, wherein the transceiver circuitry comprises first PLC circuitry that receives the first PLC signal from second PLC circuitry that is inside a power cord that is connected to the first apparatus.

25. The method of claim 24, wherein the first PLC circuitry receives the second PLC signal from third PLC circuitry that is inside the second apparatus.

26. The method of claim 25, wherein the second apparatus is a hardwired electrical appliance or system.

27. The method of claim 22, further comprising receiving, by the transceiver circuitry, an indication of a length of time that the first apparatus has been on.

* * * * *